US008609246B2

(12) United States Patent
Sun et al.

(10) Patent No.: US 8,609,246 B2
(45) Date of Patent: Dec. 17, 2013

(54) ELECTROCONDUCTIVE FINE PARTICLES, ANISOTROPIC ELECTROCONDUCTIVE MATERIAL, AND ELECTROCONDUCTIVE CONNECTION STRUCTURE

(75) Inventors: Ren-de Sun, Osaka (JP); Kiyoto Matsushita, Shiga (JP); Taku Sasaki, Osaka (JP); Shinya Uenoyama, Shiga (JP); Masaki Okuda, Shiga (JP); Nobuyuki Okinaga, Shiga (JP)

(73) Assignee: Sekisui Chemical Co., Ltd., Osaka (JP)

( * ) Notice: Subject to any disclaimer, the term of this patent is extended or adjusted under 35 U.S.C. 154(b) by 555 days.

(21) Appl. No.: 12/450,704

(22) PCT Filed: Mar. 31, 2008

(86) PCT No.: PCT/JP2008/056401
§ 371 (c)(1),
(2), (4) Date: Dec. 28, 2009

(87) PCT Pub. No.: WO2008/132933
PCT Pub. Date: Nov. 6, 2008

(65) Prior Publication Data
US 2010/0112353 A1  May 6, 2010

(30) Foreign Application Priority Data

Apr. 13, 2007  (JP) ................................ 2007-106319
Apr. 13, 2007  (JP) ................................ 2007-106320
Oct. 17, 2007  (JP) ................................ 2007-270510
Oct. 17, 2007  (JP) ................................ 2007-270511

(51) Int. Cl.
*B32B 15/02*     (2006.01)
(52) U.S. Cl.
USPC ........................................ 428/407; 428/402

(58) Field of Classification Search
USPC ......................................... 428/402, 403, 407
See application file for complete search history.

(56) References Cited

U.S. PATENT DOCUMENTS

| 3,573,008 A | 3/1971 | Akin | |
| 2003/0119299 A1* | 6/2003 | Jiang et al. | ..................... 438/612 |
| 2007/0202335 A1* | 8/2007 | Kubota | .......................... 428/402 |

FOREIGN PATENT DOCUMENTS

| EP | 0 985 486 | | 3/2000 |
| EP | 1 329 911 | | 7/2003 |
| JP | 2001-220691 | | 8/2001 |
| WO | WO 2006/006688 | * | 1/2006 |
| WO | 2007/061216 | * | 5/2007 |

OTHER PUBLICATIONS

English Machine translation of KR 2005/019664, Mar. 2005, Dong-Yeol.*
English Machine translation of JP 09-213719, Aug. 1997, Laska.*
European Office Action issued Oct. 18, 2012 in corresponding Application No. EP 08 739 514.1.

* cited by examiner

*Primary Examiner* — Callie Shosho
*Assistant Examiner* — Ronak Patel
(74) *Attorney, Agent, or Firm* — Wenderoth, Lind & Ponack, L.L.P.

(57) ABSTRACT

A conductive fine particle, which is used for conductive connection between fine electrodes and tends not to give rise to a crack in the solder layer or disconnection caused by breakage in the connection interface between an electrode and the conductive fine particle even with a drop impact and the like, and tends not to have fatigue even after repetitive heating and cooling; an anisotropic conductive material obtained by using the conductive fine particle; and a conductive connection structure.

7 Claims, 3 Drawing Sheets

ELECTROCONDUCTIVE FINE PARTICLES, ANISOTROPIC ELECTROCONDUCTIVE MATERIAL, AND ELECTROCONDUCTIVE CONNECTION STRUCTURE

This application is a U.S. national stage of International Application No. PCT/JP2008/056401 filed Mar. 31, 2008.

TECHNICAL FIELD

The present invention relates to a conductive fine particle which is used for conductive connection between fine electrodes. More specifically, the present invention relates to a conductive fine particle, which tends not to give rise to a crack in the solder layer or disconnection caused by breakage in the connection interface between an electrode and the conductive fine particle even with a drop impact and the like, and tends not to have fatigue even after repetitive heating and cooling. Further, the present invention relates to an anisotropic conductive material obtained by using the conductive fine particle, and a conductive connection structure.

BACKGROUND ART

Conventionally, integrated circuits (IC), or large-scale integrated circuits (LSI) have been connected to a printed substrate by soldering process. However, soldering has failed to connect the IC or the LSI to the printed substrate efficiently. Furthermore, it has been hard to improve the packaging density of the IC or the LSI by using soldering.

In order to solve these problems, there has been developed a BGA (ball grid array) package, in which the electronic devices are connected to a substrate by using a so-called solder ball. In a BGA, heating causes the solder balls to melt, and connection between the device and the printed circuit board takes place. As the result, not only the production efficiency but also the packaging density can be greatly improved by using the BGA package.

However, since multi-layering of a substrate has been developed in recent years and a multilayer substrate is vulnerable to an effect of usage environment, there has been a problem that disconnection tends to occur due to the stress and strain appearing in the substrates.

For example, in a case where a semiconductor is connected to a substrate by using a solder ball, a stress is applied to the solder ball because the linear coefficient of expansion is different between the semiconductor and the substrate. As a result, there has been a case where a crack occurs in the solder ball and disconnection is caused.

In response to the above problem, Patent Document 1 discloses a conductive fine particle which comprises a metal layer containing a high-conductive metal, which is formed on the surface of a resin fine particle, and a solder layer further formed on the surface of the metal layer. When a conductive fine particle of this kind is used, the flexible resin particle can alleviate the stress applied to the conductive fine particle. Since a solder layer is formed on the outermost surface of the conductive fine particle, conductive connection between electrodes is easily allowed.

However, when the conductive fine particle, in which a solder layer is formed on the surface of a resin fine particle, is used in electronic device such as a cell-phone, there has been an issue where a drop impact and the like causes a crack in the solder layer or breakage in a connection interface between the electrode and the conductive fine particle. There has been a problem that the crack in the solder layer and breakage in the connection interface causes disconnection between the electrode and the conductive fine particle.

Further, in a case where a conductive fine particle with a solder layer formed therein is mounted onto the electrodes of substrates, the conductive fine particle is placed on an electrode formed on a first substrate and the solder layer is melted by reflowing, so that the conductive fine particle is fixed to the first electrode (process 1). Subsequently, an electrode formed on a second substrate and the electrode formed on the first substrate are placed opposite to each other and then reflowing is carried out, so that conductive connection is allowed between the electrodes on the substrates (process 2).

However, when the electrodes on the substrates are conductively connected with use of the conductive fine particle disclosed in Patent Document 1, there has been a case where a solder layer is melted in the process 1 and the solder layer adequate for conductively connecting the electrode on the second substrate is not left on the surface of the metal layer of the conductive fine particle. As a result, there has been a case where conductive connection is not allowed.

Further, a temperature in an electronic device rises because of heating in an electronic part of the electronic device during use and the temperature in the electronic device is lowered to room temperature after the use of the electronic device. Accordingly, repetition of heating and cooling, namely, "heat cycle" is conducted in the electronic device. Repetition of this heat cycle may have caused a case where thermal fatigue occurs in the solder layer and the connection interface of the electrode and the conductive fine particle is destroyed, so that disconnection is caused.

Patent Document 1: Japanese Kokai Publication 2001-220691 (JP-A 2001220691)

DISCLOSURE OF THE INVENTION

Problems to be Solved by the Invention

It is an object of the present invention to provide: a conductive fine particle, which is used for conductive connection between fine electrodes and tends not to give rise to a crack in the solder layer or disconnection caused by breakage in the connection interface between an electrode and the conductive fine particle even with a drop impact and the like, and tends not to have fatigue even after repetitive heating and cooling; an anisotropic conductive material obtained by using the conductive fine particle; and a conductive connection structure.

Means for Solving the Problems

The present invention 1 relates to a conductive fine particle, which comprises a solder layer containing tin and being formed on the surface of a resin fine particle, with nickel adhered to the surface of the solder layer, and contains 0.0001 to 5.0% by weight of the nickel with respect to a total of a metal contained in the solder layer and the nickel adhered to the surface of the solder layer.

Further, the present invention 2 relates to a conductive fine particle, which comprises a solder layer containing tin and nickel and being formed on the surface of a resin fine particle, and contains 0.01 to 3.0% by weight of the nickel with respect to a total of a metal contained in the solder layer.

Hereinafter, the present invention will be described in detail.

The conductive fine particle of the present invention 1 comprises a solder layer containing tin and being formed on the surface of a resin fine particle.

The conductive fine particle of the present invention 1 comprises a resin fine particle as a base fine particle. Accordingly, even when distortion, or expansion or contraction because of change in the external environment occurs in the substrate to which the conductive fine particle is conductively connected, the flexible resin fine particle can alleviate a stress applied to the conductive fine particle.

The resin fine particle is not particularly limited, and examples thereof include resin fine particles comprising polyolefin resin, acryl resin, polyalkylene terephthalate resin, polysulfone resin, polycarbonate resin, polyamide resin, phenolformaldehyde resin, melamine formaldehyde resin, benzoguanamine formaldehyde resin, urea formaldehyde resin, and the like.

The polyolefin resin is not particularly limited and includes, for example, polyethylene resin, polypropylene resin, polystyrene resin, polyisobutylene resin, polybutadiene resin, polyvinyl chloride resin, polyvinylidene chloride resin, polytetrafluoroethylene resin, and the like.

The acryl resin is not particularly limited and includes, for example, polymethyl methacrylate resin, polymethyl acrylate resin, and the like.

These resins may be used alone or in combination of two or more kinds.

The lower limit of 10% K value of the resin fine particle is preferably 1000 MPa and the upper limit thereof is preferably 15000 MPa. In the case that the 10% K value is smaller than 1000 MPa, the resin fine particle may be destroyed when compressive deformation of the resin fine particle is carried out. In the case that the 10% K value is larger than 15000 MPa, the conductive fine particle may damage the electrode. The more preferable lower limit of the 10% K value is 2000 MPa and the more preferable upper limit thereof is 10000 MPa.

Here, the 10% K value can be calculated by assigning a value of a compressive displacement (mm) to the following equation, the compressive displacement being obtained under conditions where the resin fine particle is compressed at a compression velocity of 2.6 mN/sec and a maximum test load of 10 g on a flat end face of a diamond column of 50 μm in diameter, with use of a Micro Compression Testing Machine (for example, PCT-200, produced by SHIMADZU CORPORATION):

$$K \text{ value}(N/mm^2) = (3/\sqrt{2}) \cdot F \cdot S^{-3/2} \cdot R^{-1/2}$$

F: load value (N) at 10% compressive deformation of resin fine particle
S: compressive displacement (mm) at 10% compressive deformation of resin fine particle
R: radius of resin fine particle (mm)

For the resin fine particle, the preferable lower limit of an average particle diameter is 10 μm and the preferable upper limit thereof is 2000 μm. When the average particle diameter is smaller than 10 μm, resin fine particles tend to be aggregated, so that the conductive fine particle obtained by using the aggregated resin fine particles may have adjacent electrodes short-circuited. When the average particle diameter is larger than 2000 μm, the particle diameter may exceed a suitable particle diameter as an anisotropic conductive material. The more preferable lower limit of the average particle diameter is 30 μm and the more preferable upper limit thereof is 1500 μm. The further preferable lower limit of the average particle diameter is 50 μm and the further preferable upper limit thereof is 1000 μm.

Here, the average particle diameter of the resin fine particles indicates an average value of the diameters obtained by observing randomly-selected 50 resin fine particles with use of an optical microscope or an electronic microscope.

Further, for the resin fine particle, the preferable upper limit of a CV value is 15%. When the CV value exceeds 15%, the connection reliability of the conductive fine particle may be lowered. The more preferable upper limit of the CV value is 10%. Here, the CV value is a numeral in percentage (%) indicative of the value obtained by dividing the standard deviation by the average particle diameter.

A method for producing the resin fine particle is not particularly limited, and examples thereof include a polymerization method, a method using a polymer protectant, a method using a surfactant, and the like.

The polymerization method is not particularly limited, and examples thereof include emulsion polymerization, suspension polymerization, seed polymerization, dispersion polymerization, seed dispersion polymerization and the like.

The conductive fine particle according to the present invention 1 comprises a solder layer containing tin and being formed on the surface of a resin fine particle. Here, the solder layer is preferably formed on the outermost surface of the conductive fine particle.

According to the present invention 1, the solder layer can improve its strength and the like by containing tin therein.

Further, according to the present invention 1, the solder layer contains tin as an essential metal, and further, the solder layer may contain a metal such as silver, antimony, copper, bismuth, indium, germanium, aluminum, zinc and nickel. Examples of the solder layer include a solder layer containing tin, tin/silver, tin/zinc, tin/silver/copper, tin/bismuth, or the like. Here, when nickel is adhered to the surface of the solder layer, nickel may be included as a metal contained in the solder layer.

According to the present invention 1, a solder layer containing tin/silver is preferably used, because the melting point of the solder layer can be lowered and the strength thereof can be improved.

The solder layer may contain silver. A content of silver with respect to a total of the metal contained in the solder layer and nickel adhered to the surface of the solder layer is not particularly limited, and the preferable lower limit is 0.5% by weight and the preferable upper limit is 10% by weight. When the content of silver is in the range of 0.5 to 10% by weight with respect to the total of the metal contained in the solder layer and nickel adhered to the surface of the solder layer, the melting point of the solder layer is lowered and the strength of the solder layer is improved. The more preferable lower limit of the content of silver is 0.7% by weight and the more preferable upper limit thereof is 5% by weight with respect to the total of the metal contained in the solder layer and nickel adhered to the surface of the solder layer.

A content of tin with respect to a total of the metal contained in the solder layer and nickel adhered to the surface of the solder layer is not particularly limited, and the remainder of the metal other than tin, such as nickel and silver, may be defined as the content of tin. The preferable lower limit of the content of tin is 85% by weight and the preferable upper limit thereof is 99.4999% by weight with respect to the total of the metal contained in the solder layer and nickel adhered to the surface of the solder layer.

A thickness of the solder layer is not particularly limited, and the preferable lower limit is 1 μm and the preferable upper limit is 50 μm. When the thickness of the solder layer is less than 1 μm, there may be a case where the conductive fine particle cannot be bonded to the electrode. When the thickness of the solder layer is more than 50 μm, the conductive fine particles may be aggregated in forming the solder layer.

The more preferable lower limit of the thickness of the solder layer is 3 μm, and the more preferable upper limit thereof is 40 μm. Here, the thickness of the solder layer can be obtained by measuring cross-sections of randomly-selected 10 conductive fine particles with use of a scanning electron microscope (SEM) and calculating a mean value of the measurements.

The conductive fine particle according to the present invention 1 comprises nickel, which is adhered to the surface of the solder layer containing tin. When the conductive fine particle comprising nickel adhered thereto is used for connecting electrodes of substrates, a crystalline structure of an intermetallic compound is refined, which is to be formed on the connection interface between the conductive fine particle and the electrode after reflowing.

In the case that the intermetallic compound has a fine crystalline structure, the crystalline structure is less susceptible to damage. When the crystalline structure of the intermetallic compound is refined, a crack in the solder layer and disconnection caused by breakage in the connection interface between the electrode and the conductive fine particle is less likely to occur even with a drop impact and the like. Further, the conductive fine particle can be obtained, which tends not to have fatigue even after repetitive heating and cooling. Furthermore, it is presumable that the fine crystalline structure of the intermetallic compound, which is distributed in the connection interface, exerts an anchor effect, and therefore, the breakage is less likely to be caused in the connection interface between the conductive fine particle and the electrode even with the drop impact and the like.

Moreover, it is presumable that adhesion of the nickel on the surface of the solder layer containing tin allows the tin contained in the solder layer and nickel to preferentially form the fine crystalline structure of the intermetallic compound in reflowing. In particular, when the conductive fine particle according to the present invention 1 is mounted on the electrode in which a nickel-phosphorus plating layer and an immersion-gold plating layer are sequentially formed toward the outermost surface, tin and nickel form the fine crystalline structure of the intermetallic compound at the time of reflowing. Consequently, diffusion of the nickel into the solder layer is prevented, which is derived from the nickel-phosphorus plating layer. By preventing the diffusion of the nickel derived from the nickel-phosphorus plating layer, it is possible to restrain formation of a phosphorus concentration layer, which reduces the strength of the connection interface between the solder layer and the electrode.

Here, adhesion of nickel indicates a state where nickel exists on the surface of the solder layer and a nickel layer completely covering the surface of the solder layer is not formed.

An adhesion amount of nickel to be adhered to the surface of the solder layer is defined by the content of nickel with respect to the total of the metal contained in the solder layer and the nickel adhered to the surface of the solder layer. The lower limit of the content of nickel is 0.0001% by weight and the upper limit thereof is 5.0% by weight. When the content of nickel is less than 0.0001% by weight, the anchor effect is not sufficiently exerted and breakage in the connection interface between the electrode and the conductive fine particle tends to occur with a drop impact and the like, so that disconnection is caused. When the content of nickel is more than 5.0% by weight, there may occur a case where flexibility of the conductive fine particle is deteriorated or the electrode cannot be mounted at the time of reflowing. The preferable lower limit of the content of nickel is 0.002% by weight and the preferable upper limit thereof is 3.0% by weight.

Here, the content of nickel can be measured with use of a fluorescent X-ray analyzer (EDX-800HS, produced by SHIMADZU CORPORATION) and the like. Further, adhesion of nickel on the surface of the solder layer can be confirmed with use of a FE-SEM (S-4100, produced by Hitachi, Ltd.).

The conductive fine particle according to the present invention 1 is not particularly limited so long as the solder layer containing tin is formed on the outermost surface thereof and nickel is adhered to the solder layer containing tin at a predetermined percentage. However, the conductive fine particle preferably has a metal layer between the resin fine particle and the solder layer containing tin so as to enhance the connection reliability between the conductive fine particle and the electrode. The conductive fine particle according to the present invention 1 preferably comprises a metal layer and a solder layer containing tin, which are sequentially formed on the surface of the conductive fine particle.

As a metal forming the metal layer, there may be listed gold, silver, copper, platinum, palladium, cobalt, nickel and the like. Of these, copper is preferably contained in the metal layer, since copper has an excellent effect of enhancing the connection reliability between the conductive fine particle and the electrode. Here, the metal layer may be formed directly on the resin fine particle, or alternatively, a base metal layer such as a nickel layer may be formed between the metal layer and the resin fine particle.

The thickness of the metal layer is not particularly limited, and the preferable lower limit is 1 μm and the preferable upper limit is 70 μm. When the thickness of the metal layer is less than 1 μm, there may be a case where sufficient conductivity cannot be obtained. When the thickness of the metal layer is more than 70 μm, there may be a case where flexibility of the conductive fine particle is deteriorated. The more preferable lower limit of the thickness of the metal layer is 3 μm, and the more preferable upper limit of the thickness thereof is 50 μm.

Here, the thickness of the metal layer can be obtained by measuring cross-sections of randomly-selected 10 conductive fine particles with use of a scanning electron microscope (SEM) and calculating a mean value of the measurements.

Moreover, when including the metal layer, the conductive fine particle according to the present invention 1 preferably comprises a barrier layer further formed between the metal layer and the solder layer containing tin. The conductive fine particle according to the present invention 1 preferably comprises a metal layer and a barrier layer, which are sequentially formed between the surface of the resin fine particle and the solder layer containing tin.

When the conductive fine particle according to the present invention 1 comprises the metal layer, the solder layer containing tin, which exists on the outermost surface of the conductive fine particle, and the metal layer will be in contact with one another without the barrier layer. In such a case, the tin contained in the solder layer containing tin, and a metal, such as copper, contained in the metal layer form an alloy, so that an alloy layer (e.g. tin-copper alloy), which is hard and fragile, is formed on the interface between the solder layer containing tin and the metal layer. Without the barrier layer, a coarse alloy structure tends to be formed on the interface between the solder layer containing tin and the metal layer. When such a conductive fine particle is used for connection of circuit substrates and the like, a drop impact and the like may break the hard and fragile alloy layer, which may cause disconnection. Further, when a coarse alloy structure is formed on the interface between the solder layer containing tin and the metal layer, wettability of the solder layer containing tin is reduced, so that the strength of the connection interface between the conductive fine particle and the electrode is reduced and disconnection may be caused on the connection interface.

A material forming the barrier layer is not particularly limited, and examples thereof include nickel, titanium, tantalum, titanium nitride, zirconia, zirconia nitride and the like. Of these, the barrier layer preferably contains nickel, since formation of the barrier layer becomes easy. Further, the barrier layer preferably has an amorphous structure, and specific examples thereof include a nickel-phosphorus layer, a nickel-boron layer and the like. When the barrier layer has the amorphous structure, a grain boundary is reduced, so that copper becomes less likely to be diffused into the solder layer.

The thickness of the barrier layer is not particularly limited, and the preferable lower limit is 0.2 μm and the preferable upper limit is 5 μm. When the thickness of the barrier layer is less than 0.2 μm, there may be a case where diffusion of a metal such as copper into the solder layer cannot be prevented, or formation of a hard and fragile alloy layer (tin-copper) on the interface between the solder layer and the metal layer containing copper cannot be prevented. As a result, a hard and fragile alloy layer may be formed on the interface of the solder layer and the metal layer. When the thickness of the barrier layer is more than 5 μm, flexibility of the conductive fine particle may be deteriorated. The more preferable lower limit of the barrier layer is 0.5 μm and the more preferable upper limit of the barrier layer is 3 μm.

Here, the thickness of the barrier layer can be obtained by measuring cross-sections of randomly-selected 10 conductive fine particles with use of a scanning electron microscope (SEM) and calculating a mean value of the measurements.

It is easy for the conductive fine particle according to the present invention 1 to conductively connect the electrodes with each other, since nickel is adhered to the surface of the solder layer containing tin. The reason for this is presumably that adhesion of nickel on the surface of the solder layer containing tin allows the solder layer containing tin to exist on the outermost surface of the conductive fine particle, even after the conductive fine particle according to the present invention 1 being mounted on the electrode formed on one substrate, so that the electrodes are conductively connected easily.

A method for producing the conductive fine particle according to the present invention 1 is not particularly limited, and examples thereof include the following method.

First, in a case where a metal layer is formed on the surface of a resin fine particle, a nickel layer as a base plating layer (hereinafter, also referred to as a base nickel plating layer) is formed on the surface of the resin fine particle by electroless plating.

Next, a metal layer is formed on the surface of the base nickel plating layer.

A method for forming the metal layer is not particularly limited and examples thereof include electroplating, electroless plating and the like.

Next, in a case where a barrier layer is formed on the surface of the metal layer, a method for forming, for example, a nickel layer as the barrier layer is not particularly limited, and examples thereof include electroplating, electroless plating and the like.

Then, a solder layer containing tin is formed on the surface of the barrier layer.

A method for forming the solder layer is not particularly limited, and examples thereof include electroplating.

Subsequently, nickel is adhered to the surface of the solder layer containing tin so that a content of the nickel becomes 0.0001 to 5.0% by weight with respect to a total of the metal, which is contained in the solder layer containing tin, and the adhered nickel.

A method for adhering nickel on the surface of the solder layer containing tin is not particularly limited as long as the solder layer containing tin is not completely covered with nickel, and examples thereof include electroless plating, electroplating, sputtering method and the like. After the solder layer containing tin is formed, nickel may be adhered to the surface of the solder layer containing tin by electroless plating, sputtering method, or the like, so that nickel is partially adhered to the surface of the solder layer containing tin.

With nickel adhered to the surface of the solder layer containing tin, a connection interface between the electrode and the conductive fine particle becomes resistant to breakage, even in a case where nickel is not contained in the solder layer containing tin and the drop impact and the like is applied. As a result, disconnection tends not to be caused. Further, electrodes can be conductively connected easily by using the conductive fine particle according to the present invention 1.

Here, a part of the nickel adhered to the surface of the solder layer containing tin may be diffused into the solder layer containing tin.

As a method for adhering nickel to the surface of the solder layer, electroless plating is preferably used. In the case of using electroless plating, an adhesion amount of nickel can be controlled by appropriately setting a concentration and pH of electroless plating solution, a reaction temperature, a reaction time of plating and the like.

A conductive fine particle according to the present invention 2 comprises a solder layer which contains tin and nickel and is formed on the surface of a resin fine particle.

A composition and the like of the resin fine particle in the conductive fine particle according to the present invention 2 is the same as that of the resin fine particle in the conductive fine particle according to the present invention 1.

The conductive fine particle according to the present invention 2 comprises a solder-layer, which contains tin and nickel and is formed on the surface of a resin fine particle. Here, the solder layer is preferably formed on the outermost surface of the conductive fine particle.

According to the present invention 2, the solder layer can improve strength and the like by containing tin. Further, since nickel is contained in the solder layer at a predetermined percentage, when the conductive fine particle according to the present invention 2 is connected with an electrode, fine crystalline structure of an intermetallic compound is formed on the interface of the conductive fine particle and the electrode. As the fine crystalline structure of the intermetallic compound exerts anchor effect, the connection interface between the electrode and the conductive fine particle is not to be destroyed even with the drop impact and the like, so that disconnection is not to be caused.

The solder layer contains tin and nickel as essential metals, and further, the solder layer may also contain a metal such as silver, antimony, copper, bismuth, indium, germanium, aluminum and zinc. Examples of the solder layer may include a solder layer containing tin/nickel, tin/nickel/silver, tin/nickel/zinc, tin/nickel/silver/copper, tin/nickel/bismuth, or the like.

Especially in the present invention 2, a solder layer containing tin/nickel/silver is preferably used, since the melting point of the solder layer can be lowered and the strength of the solder layer can be improved.

The lower limit of the content of nickel is 0.01% by weight and the upper limit thereof is 3.0% by weight with respect to a total of the metal contained in the solder layer. When the content of nickel is less than 0.01% by weight with respect to the total of the metal contained in the solder layer, the anchor effect is not sufficiently exerted and breakage in the connection interface between the electrode and the conductive fine particle tends to occur with the drop impact and the like, so that disconnection is caused. When the content of nickel is more than 3.0% by weight with respect to the total of the metal contained in the solder layer, there may be a case where flexibility of the conductive fine particle is deteriorated or the melting point of the solder layer is extremely raised. The preferable lower limit of the content of nickel is 0.02% by weight and the preferable upper limit thereof is 1.0% by weight with respect to the total of the metal contained in the solder layer. Further, the more preferable lower limit of the content of nickel is 0.05% by weight and the more preferable upper limit thereof is 0.2% by weight with respect to the total of the metal contained in the solder layer.

The solder layer may contain silver. A content of silver with respect to the total of the metal contained in the solder layer is not particularly limited, and the preferable lower limit is 0.5% by weight and the preferable upper limit is 10% by weight. When the content of silver is in a range from 0.5 to 10% by weight with respect to the total of the metal contained in the solder layer, the melting point of the solder layer is lowered and the strength of the solder layer is improved. The more preferable lower limit of the content of silver is 0.7% by weight and the more preferable upper limit thereof is 5% by weight with respect to the total of the metal contained in the solder layer.

A content of nickel with respect to the total of the metal contained in the solder layer is not particularly limited, and the remainder of the metal other than tin, such as nickel and silver, may be defined as the content of tin. The preferable lower limit of the content of tin is 87% by weight and the preferable upper limit thereof is 99.49% by weight with respect to the total of the metal contained in the solder layer.

The thickness of the solder layer is not particularly limited, and the preferable lower limit is 1 μm and the preferable upper limit is 50 μm. When the thickness of the solder layer is less than 1 μm, there may be a case where the conductive fine particle cannot be bonded to the electrode. When the thickness of the solder layer is more than 50 μm, there may be a case where the conductive fine particles are aggregated in forming the solder layer. The more preferable lower limit of the thickness of the solder layer is 3 μm and the more preferable upper limit thereof is 40 μm.

Here, the thickness of the solder layer can be obtained by measuring cross-sections of randomly-selected 10 conductive fine particles with use of a scanning electron microscope (SEM) and calculating a mean value of the measurements.

The conductive fine particle according to the present invention 2 preferably comprises a metal layer and a barrier layer, which are sequentially formed between the surface of the resin fine particle and the solder layer containing tin and nickel.

In the present invention 2, a metal constituting the metal layer is not particularly limited; however, the metal layer is preferably a copper layer since the copper can enhance the conductivity of the resin fine particle without lowering flexibility thereof.

Here, the metal layer may be formed directly on the resin fine particle. Alternatively, a base metal layer such as a nickel layer may be interposed between the metal layer and the resin fine particle.

The thickness of the metal layer is not particularly limited, and the preferable lower limit is 1 μm and the preferable upper limit is 70 μm. When the thickness of the metal layer is less than 1 μm there may be a case where sufficient conductivity cannot be obtained. When the thickness of the metal layer is more than 70 μm, there may be a case where flexibility of the conductive fine particle is deteriorated. The more preferable lower limit of the thickness of the metal layer is 3 μm, and the more preferable upper limit of the thickness thereof is 50 μm.

Here, the thickness of the metal layer can be obtained by measuring cross-sections of randomly-selected 10 conductive fine particles with use of a scanning electron microscope (SEM) and calculating a mean value of the measurements.

The conductive fine particle according to the present invention 2 preferably comprises a barrier layer, which is formed between the metal layer and the solder layer containing tin and nickel. Without the barrier layer, the solder layer existing on the outermost surface of the conductive fine particle and the metal layer are in contact with one another, and therefore, there may be a case where the tin contained in the solder layer and a metal such as copper contained in the metal layer may form an alloy, so that an alloy layer (e.g. tin-copper alloy), which is hard and fragile, is formed on the interface between the solder layer and the metal layer. Without the barrier layer, a coarse alloy structure tends to be formed on the interface between the solder layer and the metal layer. When such a conductive fine particle is used for connection of circuit substrates and the like, a drop impact may break the hard and fragile alloy layer, with a result that disconnection may be caused. Further, when a coarse alloy structure is formed on the interface between the solder layer and the metal layer, wettability of the solder layer is reduced. Consequently, the strength of the connection interface between the conductive fine particle and the electrode is reduced, so that disconnection may be caused on the connection interface. The barrier layer has a role of solving such a problem.

In the conductive fine particle according to the present invention 2, a material to form the barrier layer is not particularly limited, and examples thereof include nickel, titanium, tantalum, titanium nitride, zirconia, zirconia nitride and the like. Of these, the barrier layer preferably contains nickel, since formation of the barrier layer becomes easy. Further, the barrier layer preferably has an amorphous structure, and specific examples thereof include a nickel-phosphorus layer, a nickel-boron layer and the like. When the barrier layer has the amorphous structure, a grain boundary is reduced, so that copper becomes less likely to be diffused into the solder layer.

The thickness of the barrier layer is not particularly limited, and the preferable lower limit is 0.2 μm and the preferable upper limit is 5 μm. When the thickness of the barrier layer is less than 0.2 μm, there may be a case where diffusion of a metal such as copper into the solder layer cannot be prevented. Consequently, there may be a case where a hard and fragile alloy layer is formed on the interface between the solder layer and the metal layer. When the thickness of the barrier layer is more than 5 μm, flexibility of the conductive fine particle may be deteriorated. The more preferable lower limit of the thickness of the barrier layer is 0.5 μm and the more preferable upper limit thereof is 3 μm.

Here, the thickness of the barrier layer can be obtained by measuring cross-sections of randomly-selected 10 conductive fine particles with use of a scanning electron microscope (SEM) and calculating a mean value of the measurements.

A method for producing the conductive fine particle according to the present invention 2 is not particularly limited, and examples thereof include the following method.

First, in a case where a copper layer is formed as a metal layer on the surface of a resin fine particle, a nickel layer as a base plating layer (hereinafter, also referred to as a base nickel plating layer) is formed on the surface of the resin fine particle by electroless plating.

Next, a copper layer is formed as the metal layer on the surface of the base nickel plating layer.

A method for forming the copper layer is not particularly limited and examples thereof include electroplating and electroless plating:

Next, a barrier layer is formed on the surface of the copper layer.

Particularly, in a case where the barrier layer is a nickel layer, a method for forming the nickel layer is not particularly limited, and examples thereof include electroless plating and electroplating.

Then, a solder layer containing tin and nickel is formed on the surface of the barrier layer.

A method for forming the solder layer is not particularly limited, and examples thereof include electroplating.

Further, in the conductive fine particle according to the present invention 2, nickel may be adhered to the surface of the solder layer after the formation of the solder layer containing tin and nickel.

By dispersing the conductive fine particle according to the present invention in a binder resin, an anisotropic conductive material can be produced. Such an anisotropic conductive material also constitutes the present invention.

Examples of the anisotropic conductive material according to the present invention may include an anisotropic conductive paste, an anisotropic conductive ink, an anisotropic conductive adhesive, an anisotropic conductive film, an anisotropic conductive sheet and the like.

The binder resin is not particularly limited, and examples thereof may include a vinyl resin, a thermoplastic resin, a curable resin, a thermal plastic block copolymer, an elastomer and the like.

The vinyl resin is not particularly limited, and examples thereof include a polyvinyl acetate resin, an acryl resin, a styrene resin and the like. The thermoplastic resin is not particularly limited, and examples thereof include a polyolefin resin, an ethylene vinyl acetate copolymer, a polyamide resin and the like. The curable resin is not particularly limited, and examples thereof include an epoxy resin, a urethane resin, a polyimide resin, an unsaturated polyester resin and the like. The thermal plastic block copolymer is not particularly limited, and examples thereof include a styrene-butadiene-styrene block copolymer, a styrene-isoprene-styrene block copolymer, hydrogenated compounds of the styrene-butadiene-styrene block copolymer, hydrogenated compounds of the styrene-isoprene-styrene block copolymer and the like. These resins may be used alone or in combination of two or more kinds.

Further, the curable resin may be any one of a room-temperature curable resin, a thermosetting resin, a photocurable resin and a moisture curable resin.

In the anisotropic conductive material of the present invention, a variety of additives such as an inorganic filler, a plasticizer, an adhesion-improving agent, an antioxidant, a heat stabilizer, a light stabilizer, an ultraviolet absorber, a coloring agent, a flame retardant and an organic solvent may be contained, if needed.

A method for producing the anisotropic conductive material of the present invention is not particularly limited, and examples thereof include a method in which the conductive fine particle of the present invention is added to the binder resin and this mixture is uniformly mixed to disperse the particles to form, for example, an anisotropic conductive paste, an anisotropic conductive ink, an anisotropic conductive adhesive and the like. Further, an anisotropic conductive film, an anisotropic conductive sheet and the like may be produced by following another method, in which the conductive fine particle of the present invention is added to the binder resin, the obtained mixture is uniformly dispersed or melted by heating, the resulting solution is applied in a predetermined thickness to the face subjected to releasing treatment of release materials such as a release paper and a release film, and dried or cooled as required. As the method for producing the anisotropic conductive material of the present invention, an appropriate method may be selected from these methods in accordance with the kind of the anisotropic conductive material to be prepared.

Further, the anisotropic conductive material may be formed by not mixing but separately using the binder resin and the conductive fine particle of the present invention.

A conductive connection structure obtained by using the conductive fine particle of the present invention or the anisotropic conductive material of the present invention also constitutes the present invention.

The conductive connection structure of the present invention is a conductive connection structure in which a pair of circuit substrates are connected by filling the gap between the pair of circuit substrates with the conductive fine particle of the present invention or the anisotropic conductive material of the present invention.

Effect of the Invention

According to the present invention, it is possible to provide: a conductive fine particle which is used for conductive connection between fine electrodes and is less likely to have a crack in a solder layer nor breakage in a connection interface between an electrode and the conductive fine particle even with a drop impact and the like, and is less likely to have fatigue even after repetitive heating and cooling; an anisotropic conductive material obtained by using the conductive fine particle; and a conductive connection structure.

BEST MODE FOR CARRYING OUT THE INVENTION

Hereinafter, the present invention will be described in more detail by way of examples, but the present invention is not limited to these examples.

Example 1

(1) Production of Resin Fine Particle

An amount of 50 parts by weight of divinylbenzene and an amount of 50 parts by weight of tetramethyrolmethane tetraacrylate were copolymerized so that a resin fine particle (average particle diameter of 240 μm, CV value of 0.42%) was produced.

(2) Production of Conductive Fine Particle

Electroless nickel plating was carried out on the obtained resin fine particle to form a base nickel plating layer having a thickness of 0.3 μm on the surface of the resin fine particle. Subsequently, nickel electroplating was carried out on the resin fine particle with the base nickel plating layer formed thereon, so that the thickness of the base nickel plating layer became 5 μm. By further carrying out gold immersion plating, a gold layer having a thickness of 2 μm was formed. Furthermore, by carrying out electroplating, a solder layer, which has a thickness of 25 μm and contains tin and silver, was formed. Next, the electroplating solution was filtrated, and the obtained particle was washed with water and then dried in the vacuum dryer at a temperature of 50° C. Thus the conductive fine particle was obtained, in which a gold layer and a solder layer were sequentially formed on the surface of the resin fine particle.

An amount of 1.5 g of the conductive fine particle, in which a gold layer and a solder layer were sequentially formed on the surface of the resin fine particle, was added to an amount of 30 mL of the electroless nickel plating solution described below (solution temperature of 35° C., pH of 10.5), and the resulting plating solution was stirred while being kept at a temperature of 35° C., so that electroless nickel plating reaction was started. After five minutes from the addition of the conductive fine particle, stirring was stopped and the electroless nickel plating solution was filtrated. The obtained particle was washed with water and then dried in the vacuum dryer at a temperature of 50° C. The conductive fine particle was obtained, in which a gold layer and a solder layer were sequentially formed on the surface of the resin fine particle and nickel was adhered to the surface of the solder layer. An average particle diameter of the conductive fine particles was 300 μm and a CV value was 0.98%.

Composition of the Electroless Nickel Plating Solution
Nickel acetate: 35 g/L
Hydrazine hydrate: 50 g/L
Ethylendiamine tetraacetic acid: 20 g/L
Lactic acid: 75 g/L
Boric acid: 25 g/L The conductive fine particle in which nickel was adhered to the surface of the solder layer was analyzed with use of a fluorescent X-ray analyzer (EDX-800HS, produced by SHIMADZU CORPORATION) to find that the contents of the respective metals were 1.2% by weight of silver and 0.002% by weight of nickel, with the remainder being tin, with respect to the total of the metal contained in the solder layer and the adhered nickel.

Here, each of the thicknesses of the base nickel plating layer, the gold layer and the solder layer was obtained by measuring cross-sections of randomly-selected 10 conductive fine particles with use of a scanning electron microscope (SEM) and calculating a mean value of the measurements. The same method will be adopted in the following.

Example 2

Electroless nickel plating was carried out on the resin fine particle produced in Example 1 and a base nickel plating layer having a thickness of 0.3 μm was formed on the surface of the resin fine particle. Then, copper electroplating was carried out on the resin fine particle, in which the base nickel plating layer was formed, and a copper layer having a thickness of 10 μm was formed. Further, by carrying out electroplating, a solder layer, which has a thickness of 25 μm and contains tin and silver, was formed. Subsequently, the electroplating solution was filtrated, and the obtained particle was washed with water and then dried in the vacuum dryer at a temperature of 50° C. Thus, the conductive fine particle was obtained, in which a copper layer and a solder layer were sequentially formed on the surface of the resin fine particle.

An amount of 1.5 g of the conductive fine particle, in which a copper layer and a solder layer were sequentially formed on the surface of the resin fine particle, was added to an amount of 30 mL of the electroless nickel plating solution (solution temperature of 35° C., pH of 10.5), which was the same as that in Example 1. The resulting plating solution was stirred while being kept at a temperature of 35° C., so that electroless nickel plating reaction was started. After ten minutes from the addition of the conductive fine particle, stirring was stopped and the electroless nickel plating solution was filtrated. The obtained particle was washed with water and then dried in the vacuum dryer at a temperature of 50° C. The conductive fine particle was obtained, in which a copper layer and a solder layer were sequentially formed on the surface of the resin fine particle and nickel was adhered to the surface of the solder layer. An average particle diameter of the conductive fine particles was 310 μm and a CV value was 1.02%.

The conductive fine particle, in which nickel was adhered to the surface of the solder layer, was analyzed with use of a fluorescent X-ray analyzer (EDX-800HS, produced by SHIMADZU CORPORATION) to find that the contents of the respective metals were 1.2% by weight of silver and 0.01% by weight of nickel, with the remainder being tin, with respect to the total of the metal contained in the solder layer and the adhered nickel.

Example 3

A conductive fine particle, in which nickel was adhered to the surface of the solder layer, was obtained in the same manner as in Example 2, except that the solution temperature of the electroless nickel plating solution was changed to 40° C. and the plating reaction time was changed to eight minutes. An average particle diameter of the conductive fine particles was 310 μm and a CV value was 1.02%.

The conductive fine particle, in which nickel was adhered to the surface of the solder layer, was analyzed with use of a fluorescent X-ray analyzer (EDX-800HS, produced by SHIMADZU CORPORATION) to find that the contents of the respective metals were 1.2% by weight of silver and 0.2% by weight of nickel, with the remainder being tin, with respect to the total of the metal contained in the solder layer and the adhered nickel.

Example 4

A conductive fine particle, in which nickel was adhered to the surface of the solder layer, was obtained in the same manner as in Example 2, except that the solution temperature of the electroless nickel plating solution was changed to 40° C. and the plating reaction time was changed to 38 minutes. An average particle diameter of the conductive fine particles was 310 μm and a CV value was 1.02%.

The conductive fine particle in which nickel was adhered to the surface of the solder layer was analyzed with use of a fluorescent X-ray analyzer (EDX-800HS, produced by SHIMADZU CORPORATION) to find that the contents of the respective metals were 1.2% by weight of silver and 2.0% by weight of nickel, with the remainder being tin, with respect to the total of the metal contained in the solder layer and the adhered nickel.

Example 5

A conductive fine particle, in which nickel was adhered to the surface of the solder layer, was obtained in the same manner as in Example 2, except that the solution temperature of the electroless nickel plating solution was changed to 40° C. and the plating reaction time was changed to 60 minutes. An average particle diameter of the conductive fine particles was 310 μm and a CV value was 1.02%.

The conductive fine particle in which nickel was adhered to the surface of the solder layer was analyzed with use of a fluorescent X-ray analyzer (EDX-800HS, produced by SHIMADZU CORPORATION) to find that the contents of the respective metals were 1.2% by weight of silver and 3.0% by weight of nickel, with the remainder being tin, with respect to the total of the metal contained in the solder layer and the adhered nickel.

Example 6

Electroless nickel plating was carried out on the resin fine particle produced in Example 1 and a base nickel plating layer having a thickness of 0.3 μm was formed on the surface of the resin fine particle. Then, copper electroplating was carried out on the resin fine particle and a copper layer having a thickness of 10 μm was formed. Further, by carrying out electroplating, a solder layer, which has a thickness of 25 μm and contains tin and silver, was formed. Subsequently, the electroplating solution was filtered, and the obtained particle was washed with water and then dried in the vacuum dryer at a temperature of 50° C. Thus, the conductive fine particle was obtained, in which a copper layer and a solder layer were sequentially formed on the surface of the resin fine particle.

A palladium catalyst was supported on 1.5 g of the conductive fine particle, in which a copper layer and a solder layer were sequentially formed on the surface of the resin fine particle. Then, the palladium-catalyzed particles were added to 30 mL of the electroless nickel plating solution described below (solution temperature of 40° C., pH of 6.5), and the resulting plating solution was stirred while being kept at a temperature of 40° C., so that electroless nickel plating reaction was started. After five minutes from the addition of the conductive fine particle, stirring was stopped and the electroless nickel plating solution was filtrated. The obtained particle was washed with water and then dried in the vacuum dryer at a temperature of 50° C. The conductive fine particle was obtained, in which a copper layer and a solder layer were sequentially formed on the surface of the resin fine particle and nickel was adhered to the surface of the solder layer. An average particle diameter of the conductive fine particles was 310 μm and a CV Value was 1.02%.

Composition of the Electroless Nickel Plating Solution
Nickel sulfate: 20 g/L
Dimethylamine borane: 2 g/L
Boric acid: 20 g/L
Ammonium chloride: 30 g/L
Diethanolamine: 25 g/L The conductive fine particle, in which nickel was adhered to the surface of the solder layer, was analyzed with use of a fluorescent X-ray analyzer (EDX-800HS, produced by SHIMADZU CORPORATION) to find that the contents of the respective metals were 1.2% by weight of silver and 5.0% by weight of nickel, with the remainder being tin, with respect to the total of the metal contained in the solder layer and the adhered nickel.

Example 7

(1) Production of Resin Fine Particle

An amount of 50 parts by weight of divinylbenzene and an amount of 50 parts by weight of tetramethylolmethane tetraacrylate were copolymerized, so that a resin fine particle (average particle diameter of 240 μm, CV value of 0.42%) was produced.

(2) Production of Conductive Fine Particle

Electroless nickel plating was carried out on the produced resin fine particle and a base nickel plating layer having a thickness of 0.3 μm was formed on the surface of the resin fine particle. Then, copper electroplating was carried out on the resin fine particle, in which the base nickel plating layer was formed, and a copper layer having a thickness of 10 μm was formed. Further, by carrying out nickel electroplating, a nickel layer having a thickness of 1 μm was formed. Furthermore, by carrying out electroplating, a solder layer, which has a thickness of 25 μm and contains tin and silver, was formed. Subsequently, the electroplating solution was filtrated, and the obtained particle was washed with water and then dried in the vacuum dryer at a temperature of 50° C. Thus, the conductive fine particle was obtained, in which a copper layer, a nickel layer and a solder layer were sequentially formed on the surface of the resin fine particle.

An amount of 1.5 g of the conductive fine particle, in which a copper layer, a nickel layer and a solder layer were sequentially formed on the surface of the resin fine particle, was added to an amount of 30 mL of the electroless nickel plating solution described below (solution temperature of 35° C., pH of 10.5), and the resulting plating solution was stirred while being kept at a temperature of 35° C., so that electroless nickel plating reaction was started. After five minutes from the addition of the conductive fine particle, stirring was stopped and the electroless nickel plating solution was filtrated. The obtained particle was washed with water and then dried in the vacuum dryer at a temperature of 50° C. The conductive fine particle was obtained, in which a copper layer, a nickel layer and a solder layer were sequentially formed on the surface of the resin fine particle and nickel was adhered to the surface of the solder layer. An average particle diameter of the conductive fine particles was 312 μm and a CV value was 0.96%.

Composition of the Electroless Nickel Plating Solution
Nickel acetate: 35 g/L
Hydrazine hydrate: 50 g/L
Ethylendiamine tetraacetic acid: 20 g/L
Lactic acid: 75 g/L
Boric acid: 25 g/L The conductive fine particle, in which nickel was adhered to the surface of the solder layer, was analyzed with use of a fluorescent X-ray analyzer (EDX-800HS, produced by SHIMADZU CORPORATION) to find that the contents of the respective metals were 1.2% by weight of silver and 0.002% by weight of nickel, with the remainder being tin, with respect to the total of the metal contained in the solder layer and the adhered nickel.

Here, each of the thicknesses of the base nickel plating layer, the copper layer, the nickel layer and the solder layer was obtained by measuring cross-sections of randomly-selected 10 conductive fine particles with use of a scanning electron microscope (SEM) and calculating a mean value of the measurements. The same method will be adopted in the following.

Example 8

The conductive fine particle, in which nickel was adhered to the surface of the solder layer, was obtained in the same manner as in Example 7, except that the plating reaction time of electroless nickel plating was changed to ten minutes. An average particle diameter of the conductive fine particles was 312 μm and a CV value was 1.02%.

The conductive fine particle, in which nickel was adhered to the surface of the solder layer was analyzed with use of a fluorescent X-ray analyzer (EDX-800HS, produced by SHIMADZU CORPORATION) to find that the contents of the respective metals were 1.2% by weight of silver and 0.01% by weight of nickel, with the remainder being tin, with respect to the total of the metal contained in the solder layer and the adhered nickel.

Example 9

The conductive fine particle, in which nickel was adhered to the surface of the solder layer, was obtained in the same manner as in Example 7, except that the solution temperature of the electroless nickel plating solution was changed to 40° C. and the plating reaction time was changed to eight minutes. An average particle diameter of the conductive fine particles was 312 μm and a CV value was 1.02%.

The conductive fine particle, in which nickel was adhered to the surface of the solder layer, was analyzed with use of a fluorescent X-ray analyzer (EDX-800HS, produced by SHIMADZU CORPORATION) to find that the contents of the respective metals were 1.2% by weight of silver and 0.2% by weight of nickel with the remainder being tin, with respect to the total of the metal contained in the solder layer and the adhered nickel.

Example 10

The conductive fine particle, in which nickel was adhered to the surface of the solder layer, was obtained in the same manner as in Example 7, except that the solution temperature of the electroless nickel plating solution was changed to 40° C. and the plating reaction time was changed to 38 minutes. An average particle diameter of the conductive fine particles was 312 μm and a CV value was 1.02%.

The conductive fine particle, in which nickel was adhered to the surface of the solder layer, was analyzed with use of a fluorescent X-ray analyzer (EDX-800HS, produced by SHIMADZU CORPORATION) to find that the contents of the respective metals were 1.2% by weight of silver and 2.0% by weight of nickel, with the remainder being tin, with respect to the total of the metal contained in the solder layer and the adhered nickel.

Example 11

The conductive fine particle, in which nickel was adhered to the surface of the solder layer, was obtained in the same manner as in Example 7, except that the solution temperature of the electroless nickel plating solution was changed to 40° C. and the plating reaction time was changed to 60 minutes. An average particle diameter of the conductive fine particles was 312 μm and a CV value was 1.02%.

The conductive fine particle, in which nickel was adhered to the surface of the solder layer, was analyzed with use of a fluorescent X-ray analyzer (EDX-800HS, produced by SHIMADZU CORPORATION) to find that the contents of the respective metals were 1.2% by weight of silver and 3.0% by weight of nickel, with the remainder being tin, with respect to the total of the metal contained in the solder layer and the adhered nickel.

Example 12

Electroless nickel plating was carried out on the resin fine particle produced in Example 7 and a base nickel plating layer having a thickness of 0.3 μm was formed on the surface of the resin fine particle. Then, copper electroplating was carried out on the resin fine particle, in which the base nickel plating layer was formed, and a copper layer having a thickness of 10 μm was formed. Further, by carrying out nickel electroplating, a nickel layer having a thickness of 1 μm was formed. Furthermore, by carrying out electroplating, a solder layer, which has a thickness of 25 μm and contains tin and silver, was formed. Subsequently, the electroplating solution was filtrated, and the obtained particle was washed with water and then dried in the vacuum dryer at a temperature of 50° C. Thus, the conductive fine particle was obtained, in which a copper layer, a nickel layer and a solder layer were sequentially formed on the surface of the resin fine particle.

A palladium catalyst was supported on 1.5 g of the conductive fine particle, in which a copper layer, a nickel layer and a solder layer were sequentially formed on the surface of a resin fine particle. Then, the palladium-catalyzed particles were added to 30 mL of the electroless nickel plating solution described below (solution temperature of 40° C., pH of 6.5), and the resulting plating solution was stirred while being kept at a temperature of 40° C., so that electroless nickel plating reaction was started. After five minutes from the addition of the conductive fine particle, stirring was stopped and the electroless nickel plating solution was filtrated. The obtained particle was washed with water and then dried in the vacuum dryer at a temperature of 50° C. The conductive fine particle was obtained, in which a copper layer, a nickel layer and a solder layer were sequentially formed on the surface of the resin fine particle and nickel was adhered to the surface of the solder layer. An average particle diameter of the conductive fine particles was 312 μm and a CV value was 1.02%.

Composition of the Electroless Nickel Plating Solution
Nickel sulfate: 20 g/L
Dimethylamine borane: 2 g/L
Boric acid: 20 g/L
Ammonium chloride: 30 g/L
Diethanolamine: 25 g/L The conductive fine particle in which nickel was adhered to the surface of the solder layer was analyzed with use of a fluorescent X-ray analyzer (EDX-800HS, produced by SHIMADZU CORPORATION) to find that the contents of the respective metals were 1.2% by weight of silver and 5.0% by weight of nickel, with the remainder being tin, with respect to the total of the metal contained in the solder layer and the adhered nickel.

Comparative Example 1

A conductive fine particle was produced in the same manner as in Example 1, except that electroless nickel plating was not carried out so that nickel was not adhered to the surface of the solder layer. An average particle diameter of the conductive fine particles was 300 μm and a CV value was 0.81%.

Comparative Example 2

A solder ball (M705, produced by Senju Metal Industry Co., Ltd., average particle diameter of 300 μm, (tin:silver:copper=96.5% by weight:3% by weight:0.5% by weight)) was used as a conductive fine particle.

Comparative Example 3

The conductive fine particle, in which nickel was adhered to the surface of the solder layer, was obtained in the same manner as in Example 6, except that the plating reaction time of electroless nickel plating was changed to seven minutes. An average particle diameter of the conductive fine particles was 310 μm and the CV value was 1.02%.

The conductive fine particle, in which nickel was adhered to the surface of the solder layer, was analyzed with use of a fluorescent X-ray analyzer (EDX-800HS, produced by SHI-MADZU CORPORATION) to find that the contents of the respective metals were 1.1% by weight of silver and 6.0% by weight of nickel, with the remainder being tin, with respect to the total of the metal contained in the solder layer and the adhered nickel.

Here, though it was possible to mount the conductive fine particle obtained in Comparative Example 3 on the electrode, detachment of part of the conductive fine particles was observed, and therefore, a drop strength test, an assembly evaluation and a heat cycle test were not carried out.

Comparative Example 4

The conductive fine particle, in which nickel was adhered to the surface of the solder layer, was obtained in the same manner as in Example 6, except that the plating reaction time of electroless nickel plating was changed to 15 minutes. An average particle diameter of the conductive fine particles was 310 μm and a CV value was 1.1%.

The conductive fine particle, in which nickel was adhered to the surface of the solder layer, was analyzed with use of a fluorescent X-ray analyzer (EDX-800HS, produced by SHI-MADZU CORPORATION) to find that the contents of the respective metals were 1.1% by weight of silver and 10% by weight of nickel, with the remainder being tin, with respect to the total of the metal contained in the solder layer and the adhered nickel.

Here, since the conductive fine particle obtained in Comparative Example 4 could not be mounted on the electrode, a drop strength test, an assembly evaluation and a heat cycle test were not carried out.

Comparative Example 5

A conductive fine particle was produced in the same manner as in Example 7, except that electroless nickel plating was not carried out so that nickel was not adhered to the surface of the solder layer. An average particle diameter of the conductive fine particles was 312 μm and a CV value was 0.81%.

Comparative Example 6

A conductive fine particle, in which nickel was adhered to the surface of the solder layer, was obtained in the same manner as in Example 12, except that the plating reaction time of electroless nickel plating was changed to seven minutes. An average particle diameter of the conductive fine particles was 312 μm and a CV value was 1.02%.

The conductive fine particle, in which nickel was adhered to the surface of the solder layer, was analyzed with use of a fluorescent X-ray analyzer (EDX-800HS, produced by SHI-MADZU CORPORATION) to find that the contents of the respective metals were 1.1% by weight of silver and 6.0% by weight of nickel, with the remainder being tin, with respect to the total of the metal contained in the solder layer and the adhered nickel.

Here, though it was possible to mount the conductive fine particle obtained in Comparative Example 6 on the electrode, detachment of part of the conductive fine particle was observed, and therefore, a drop strength test, an assembly evaluation and a heat cycle test were not carried out.

Comparative Example 7

The conductive fine particle, in which nickel was adhered to the surface of the solder layer, was obtained in the same manner as in Example 12, except that the plating reaction time of electroless nickel plating was changed to 15 minutes. An average particle diameter of the conductive fine particles was 312 μm and a CV value was 1.1%.

The conductive fine particle, in which nickel was adhered to the surface of the solder layer, was analyzed with use of a fluorescent X-ray analyzer (EDX-800HS, produced by SHI-MADZU CORPORATION) to find that the contents of the respective metals were 1.1% by weight of silver and 10% by weight of nickel, with the remainder being tin, with respect to the total of the metal contained in the solder layer and the adhered nickel.

Here, since the conductive fine particle obtained in Comparative Example 7 could not be mounted on the electrode, a drop strength test, an assembly evaluation and a heat cycle test were not carried out.

<Evaluation>

The conductive fine particles obtained in Examples 1 to 12 and in Comparative Examples 1 to 7 were evaluated as follows. Table 1 shows the results.

(1) Surface Observation of the Conductive Fine Particle

Cross sections of the conductive fine particles obtained in Examples 1 to 12, Comparative Examples 3 to 4 and 6 to 7 were scanned with use of a FE-SEM (S-4100, produced by Hitachi, Ltd.). In each of the conductive fine particles obtained in Examples 1 to 12 and Comparative Examples 3 and 6, nickel was observed to be adhered to the surface of the solder layer. In each of the conductive fine particles obtained in Comparative Examples 4 and 7, a nickel plating layer was observed to be formed on the surface of the solder layer.

(2) Prop Strength Test

A Flux (Ws-9160-M7, Produced by Cookson Electronics Co.) was applied to 112 electrode lands (diameter of 280 μm) disposed on a silicon chip (6 mm long×6 mm wide) at 0.5 mm intervals. The obtained conductive fine particles were placed in all the electrode lands and reflowing (heating temperature of 250° C., 30 seconds) was carried out, so that the conductive fine particles were mounted onto the electrode lands.

Next, a solder paste (M705-GRN360-K2-V, produced by Senju Metal Industry Co., Ltd.) was applied to a printed substrate on which a copper electrode (diameter of 305 μm) was formed. On the printed substrate, 15 silicon chips each having the conductive fine particle mounted thereon were placed and reflowing (heating temperature of 250° C., 30 seconds) was carried out so that 15 silicon chips were mounted on the printed substrate. Thus, a conductive connection structure was obtained.

In conformity to JESD22-B111 of JEDEC standards, a drop strength test was carried out on the obtained conductive connection structure. Since the obtained conductive connection structure comprises a daisy chain circuit therein, even disconnection only in a single electrode land can be detected.

The number of drops for disconnecting all of the 15 silicon chips was measured.

Here, in the electrode land, a copper layer, a nickel-phosphor layer, and a gold layer were sequentially formed towards the outermost surface. The same configuration is adopted in the following.

(3) Evaluation on Mountability

A flux (WS-9160-M7, produced by Cookson Electronics Co.) was applied to 112 electrode lands (diameter of 280 μm) disposed on a silicon chip (6 mm long×6 mm wide) at 0.5 mm intervals. The obtained conductive fine particles were placed in all the electrode lands and reflowing (heating temperature of 250° C., 30 seconds) was carried out, so that the conductive fine particles were mounted onto the electrode lands.

In order to observe a cross section of the conductive fine particle mounted on the electrode land, a silicon chip was embedded in a resin and was precisely polished. The cross section of the conductive fine particle mounted on the electrode land was observed with use of a field-emission-type scanning electron microscope (FE-SEM) (S-4100, produced by Hitachi, Ltd.).

The mountability was evaluated following the below criteria.

○: The metal layer was completely covered with the solder layer as shown in FIG. 2, or the barrier layer was completely covered with the solder layer as shown in FIG. 4.

X: The solder layer did not exist on the surface of the metal layer as shown in FIG. 1, or the solder layer did not exist on the surface of the barrier layer as shown in FIG. 3.

(4) Temperature Cycle Test

A flux (WS-9160-M7, produced by Cookson Electronics Co.) was applied to 112 electrode lands (diameter of 280 μm) disposed on a silicon chip (6 mm long×6 mm wide) at 0.5 mm intervals. The obtained conductive fine particles were placed in all the electrode lands and reflowing (heating temperature of 250° C., 30 seconds) was carried out, so that the conductive fine particles were mounted onto the electrode lands.

Next, a solder paste (M705-GRN360-K2-V, produced by Senju Metal Industry Co., Ltd.) was applied to a printed substrate on which a copper electrode (diameter of 305 μm) was formed. On the printed substrate, a single silicon chip with the conductive fine particle mounted thereon was placed and reflowing (heating temperature of 250° C., 30 seconds) was carried out, so that a conductive connection structure was obtained.

Since the obtained conductive connection structure comprises a daisy chain circuit therein, even disconnection only in a single electrode land can be detected.

With use of the obtained conductive connection structure, the heat cycle test was carried out, in which a temperature change in a range from −40° C. to 125° C. was defined as one cycle. Here, a heat profile of the heat cycle test was as follows: the temperature was maintained at −40° C. for 10 minutes; the temperature was raised from −40° C. to 125° C. in two minutes; the temperature was maintained at 125° C. for 10 minutes; and the temperature was lowered from 125° C. to −40° C. in two minutes.

The heat cycle test was evaluated following the below criteria.

○: The cycle number that disconnection of the conductive connection structure was found was 2000 or more.

X: The cycle number that disconnection of the conductive connection structure was found was less than 2000.

TABLE 1

| | Content of nickel (% by weight) | Drop strength test Number of drops (times) | Evaluation on mountability | Temperature cycle test |
|---|---|---|---|---|
| Example 1 | 0.002 | 164 | ○ | ○ |
| Example 2 | 0.01 | 168 | ○ | ○ |
| Example 3 | 0.2 | 171 | ○ | ○ |
| Example 4 | 2.0 | 158 | ○ | ○ |
| Example 5 | 3.0 | 140 | ○ | ○ |
| Example 6 | 5.0 | 105 | ○ | ○ |
| Example 7 | 0.002 | 173 | ○ | ○ |
| Example 8 | 0.01 | 175 | ○ | ○ |
| Example 9 | 0.2 | 184 | ○ | ○ |
| Example 10 | 2.0 | 169 | ○ | ○ |
| Example 11 | 3.0 | 145 | ○ | ○ |
| Example 12 | 5.0 | 110 | ○ | ○ |
| Comparative Example 1 | 0 | 88 | X | X |
| Comparative Example 2 | 0 | 34 | — | X |
| Comparative Example 3 | 6.0 | — | — | — |
| Comparative Example 4 | 10 | — | — | — |
| Comparative Example 5 | 0 | 90 | X | X |
| Comparative Example 6 | 6.0 | — | — | — |
| Comparative Example 7 | 10 | — | — | — |

Example 13

(1) Production of Resin Fine Particle

An amount of 50 parts by weight of divinylbenzene and an amount of 50 parts by weight of tetramethylolmethane tetraacrylate were copolymerized, so that a resin fine particle (average particle diameter of 240 μm, value of 0.42%) was produced.

(2) Production of Conductive Fine Particle

Electroless nickel plating was carried out on the produced resin fine particle and a base nickel plating layer having a thickness of 0.3 μm was formed on the surface of the resin fine particle. Then, copper electroplating was carried out on the resin fine particle, in which the base nickel plating layer was formed, and a copper layer having a thickness of 10 μm was formed. Further, by carrying out electroplating with use of an electroplating solution containing tin, nickel, and silver, a solder layer having a thickness of 25 μm was formed, so that the conductive fine particle was produced, in which a copper layer and a solder layer (tin, nickel and silver) were sequentially formed on the surface of the resin fine particle. Here, an average particle diameter of the conductive fine particles was 310 μm and a CV value was 1.05%.

The obtained conductive fine particle was analyzed with use of a fluorescent X-ray analyzer (EDX-800HS, produced by SHIMADZU CORPORATION) to find that the contents of the respective metals were 3.2% by weight of silver and 0.01% by weight of nickel, with the remainder being tin, with respect to the total of the metal contained in the solder layer and the adhered nickel.

Example 14

The conductive fine particle was obtained in the same manner as in Example 13, except that the nickel concentration of the electroplating solution containing tin, nickel, and silver was adjusted. An average particle diameter of the conductive fine particles was 310 μm and a CV value was 1.05%. The obtained conductive fine particle was analyzed with use of a fluorescent X-ray analyzer (EDX-800HS, produced by SHIMADZU CORPORATION) to find that the contents of the respective metals were 3.2% by weight of silver and 0.2% by weight of nickel, with the remainder being tin, with respect to the total of the metal contained in the solder layer and the adhered nickel.

Example 15

The conductive fine particle was produced in the same manner as in Example 13, except that a nickel concentration of the electroplating solution containing tin, nickel, and silver was adjusted. An average particle diameter of the conductive fine particles was 310 μm and the CV value was 1.05%. The obtained conductive fine particle was analyzed with use of a fluorescent X-ray analyzer (EDX-800HS, produced by SHIMADZU CORPORATION) to find that the contents of respective metals were 3.2% by weight of silver and 3.0% by weight of nickel, with the remainder being tin, with respect to the total of the metal contained in the solder layer and the adhered nickel.

Example 16

Electroless nickel plating was carried out on the resin fine particle produced in Example 13 and a base nickel plating layer having a thickness of 0.3 μm was formed on the surface of the resin fine particle. Then, copper electroplating was carried out on the resin fine particle, in which the base nickel plating layer was formed, and a copper layer having a thickness of 10 μm was formed. Further, by carrying out electroless nickel plating on the resin fine particle with the copper layer formed thereon, a nickel layer having a thickness of 1 μm was formed. Furthermore, by carrying out electroplating with use of an electroplating solution containing tin, nickel, and silver, a solder layer having a thickness of 25 μm was formed, so that the conductive fine particle was obtained, in which a copper layer, a nickel layer and a solder layer were sequentially formed on the surface of the resin fine particle. Here, an average particle diameter of the conductive fine particles was 312 μm and a CV value was 1.10%.

The obtained conductive fine particle was analyzed with use of a fluorescent X-ray analyzer (EDX-800HS, produced by SHIMADZU CORPORATION) to find that the contents of the respective metals were 3.2% by weight of silver and 0.01% by weight of nickel, with the remainder being tin, with respect to the total of the metal contained in the solder layer.

Example 17

The conductive fine particle was produced in the same manner as in Example 16, except that a nickel concentration of the electroplating solution containing tin, nickel, and silver was adjusted. An average particle diameter of the conductive fine particles was 312 μm and a CV value was 1.10%. The obtained conductive fine particle was analyzed with use of a fluorescent X-ray analyzer (EDX-800HS, produced by SHIMADZU CORPORATION) to find that the contents of the respective metals were 3.2% by weight of silver and 0.2% by weight of nickel, with the remainder being tin, with respect to the total of the metal contained in the solder layer and the adhered nickel.

Example 18

The conductive fine particle was produced in the same manner as in Example 16, except that a nickel concentration of the electroplating solution containing tin, nickel, and silver was adjusted. An average particle diameter of the conductive fine particles was 312 μm and a CV value was 1.10%. The obtained conductive fine particle was analyzed with use of a fluorescent X-ray analyzer (EDX-800HS, produced by SHIMADZU CORPORATION) to find that the contents of the respective metals were 3.2% by weight of silver and 3.0% by weight of nickel, with the remainder being tin, with respect to the total of the metal contained in the solder layer and the adhered nickel.

Example 19

Electroless nickel plating was carried out on the resin fine particle produced in Example 13 and a base nickel plating layer having a thickness of 0.3 μm was formed on the surface of the resin fine particle. Then, copper electroplating was carried out on the resin fine particle, in which the base nickel plating layer was formed, and a copper layer having a thickness of 10 μm was formed. Further, by carrying out electroplating with use of electroplating solution containing tin, nickel, silver, and copper, a solder layer having a thickness of 25 μm was formed. Thus, the conductive fine particle was produced, in which a copper layer and a solder layer (tin, nickel, silver and copper) were sequentially formed on the surface of the resin fine particle. Here, an average particle diameter of the conductive fine particles was 310 μm and a CV value was 1.15%.

The obtained conductive fine particle was analyzed with use of a fluorescent X-ray analyzer (EDX-800HS, produced by SHIMADZU CORPORATION) to find that the contents of the respective metals were 3.2% by weight of silver, 0.5% by weight of copper, and 0.2% by weight of nickel, with the remainder being tin, with respect to the total of the metal contained in the solder layer.

Comparative Example 8

The conductive fine particle was produced in the same manner as in Example 13, except that an electroplating solution containing tin and silver was used instead of the electroplating solution containing tin, nickel, and silver. An average particle diameter of the conductive fine particles was 310 μm and a CV value was 1.05%.

Comparative Example 9

The conductive fine particle was produced in the same manner as in Example 16, except that an electroplating solution containing tin and silver was used instead of the electroplating solution containing tin, nickel, and silver. An average particle diameter of the conductive fine particles was 312 μm and a CV value was 1.10%.

Comparative Example 10

The conductive fine particle was produced in the same manner as in Example 19, except that an electroplating solution containing tin, silver, and copper was used instead of the electroplating solution containing tin, nickel, silver, and copper. An average particle diameter of the conductive fine particles was 310 μm and a CV value was 1.15%.

Comparative Example 11

A solder ball (M705, produced by Senju Metal Industry Co., Ltd., average particle diameter of 300 μm, (tin:silver: copper=96.5% by weight:3% by weight:0.5% by weight)) was used as a conductive fine particle.

Comparative Example 12

The conductive fine particle was produced in the same manner as in Example 13, except that a nickel concentration of the electroplating solution containing tin, nickel, and silver was adjusted. An average particle diameter of the conductive fine particles was 310 μm and a CV value was 1.05%. The obtained conductive fine particle was analyzed with use of a fluorescent X-ray analyzer (EDX-800HS, produced by SHIMADZU CORPORATION) to find that the contents of respective metals were 3.2% by weight of silver and 0.001% by weight of nickel, with the remainder being tin, with respect to the total of the metal contained in the solder layer and the adhered nickel.

Comparative Example 13

The conductive fine particle was produced in the same manner as in Example 13, except that a nickel concentration of the electroplating solution containing tin, nickel, and silver was adjusted. An average particle diameter of the conductive fine particles was 310 μm and a CV value was 1.05%. The obtained conductive fine particle was analyzed with use of a fluorescent X-ray analyzer (EDX-800HS, produced by SHIMADZU CORPORATION) to find that the contents of the respective metals were 3.2% by weight of silver and 5.0% by weight of nickel with the remainder being tin, with respect to the total of the metal contained in the solder layer and the adhered nickel. Here, the conductive fine particle obtained in Comparative Example 13 could not be mounted on the electrode, and therefore, the drop strength test was not carried out.

<Evaluation>

The conductive fine particles obtained in Examples 13 to 19 and in Comparative. Examples 8 to 13 were evaluated as follows. Table 2 shows the results.

(1) Drop Strength Test

A flux (WS-9160-M7, produced by Cookson Electronics Co.) was applied to 112 electrode lands (diameter of 280 μm) disposed on a silicon chip (6 mm long×6 mm wide) at 0.5 mm intervals. The obtained conductive fine particles were placed in all the electrode lands and reflowing (heating temperature of 250° C., 30 seconds) was carried out, so that the conductive fine particles were mounted onto the electrode lands.

Next, a solder paste (M705-GRN360-K2-V, produced by Senju Metal Industry Co., Ltd.) was applied to a printed substrate on which a copper electrode (diameter of 305 μm) was formed. On the printed substrate, 15 silicon chips each having the conductive fine particle mounted thereon were placed and reflowing (heating temperature of 250° C., 30 seconds) was carried out so that 15 silicon chips were mounted on the printed substrate. Thus, a conductive connection structure was obtained.

In conformity to JESD22-B111 of JEDEC standards, a drop strength test was carried out on the obtained conductive connection structure.

Since the obtained conductive connection structure comprises a daisy chain circuit therein, even disconnection only in a single electrode land can be detected.

Here, in the electrode land, a copper layer, a nickel-phosphor layer, and a gold layer were sequentially formed towards the outermost surface.

The drop strength test was evaluated following the below criteria.

◎: The number of drops for disconnecting all of the silicon chips was 100 or more.

Δ: The number of drops for disconnecting all of the 15 silicon chips was 50 or more and less than 100.

X: The number of drops for disconnecting all of the 15 silicon chips was less than 50.

TABLE 2

| | Base fine particle | Metal layer | Barrier layer | Solder layer | Content of nickel (% by weight) | Drop strength test |
|---|---|---|---|---|---|---|
| Example 13 | Resin fine particle | Cu | — | Sn—Ag—Ni | 0.01 | ◎ |
| Example 14 | Resin fine particle | Cu | — | | 0.2 | ◎ |
| Example 15 | Resin fine particle | Cu | — | | 3.0 | ◎ |
| Example 16 | Resin fine particle | Cu | Ni | Sn—Ag—Ni | 0.01 | ◎ |
| Example 17 | Resin fine particle | Cu | Ni | | 0.2 | ◎ |
| Example 18 | Resin fine particle | Cu | Ni | | 3.0 | ◎ |
| Example 19 | Resin fine particle | Cu | — | Sn—Ag—Cu—Ni | 0.2 | ◎ |
| Comparative Example 8 | Resin fine particle | Cu | — | Sn—Ag | 0 | Δ |
| Comparative Example 9 | Resin fine particle | Cu | Ni | Sn—Ag | 0 | Δ |
| Comparative Example 10 | Resin fine particle | Cu | — | Sn—Ag—Cu | 0 | Δ |
| Comparative Example 11 | — | — | — | Sn—Ag—Cu (Solder ball) | 0 | X |
| Comparative Example 12 | Resin fine particle | Cu | — | Sn—Ag—Ni | 0.001 | Δ |
| Comparative Example 13 | Resin fine particle | Cu | — | Sn—Ag—Ni | 5.0 | — |

INDUSTRIAL APPLICABILITY OF THE INVENTION

According to the present invention, it is possible to provide: a conductive fine particle, which is used for conductive connection between fine electrodes and tends not to give rise to a crack in the solder layer or disconnection caused by breakage in the connection interface between an electrode and the conductive fine particle even with a drop impact and the like, and tends not to have fatigue even after repetitive heating and cooling; an anisotropic conductive material obtained by using the conductive fine particle; and a conductive connection structure.

Figure 1:
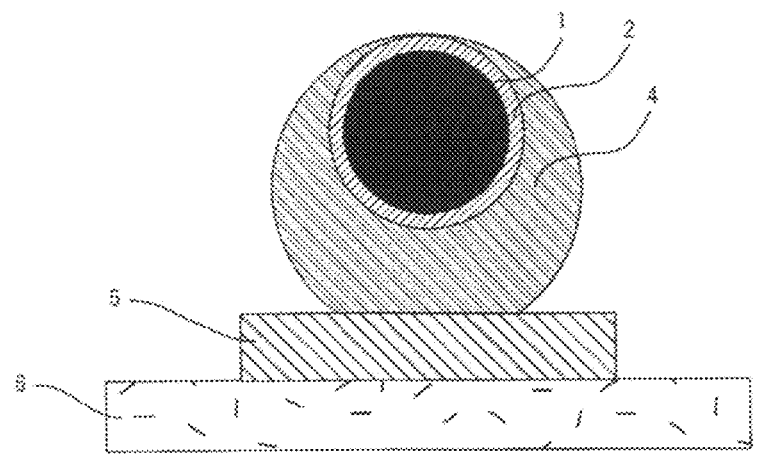
FIG. 1 is an example of a cross sectional view schematically showing a conductive fine particle after being mounted.
Figure 2:
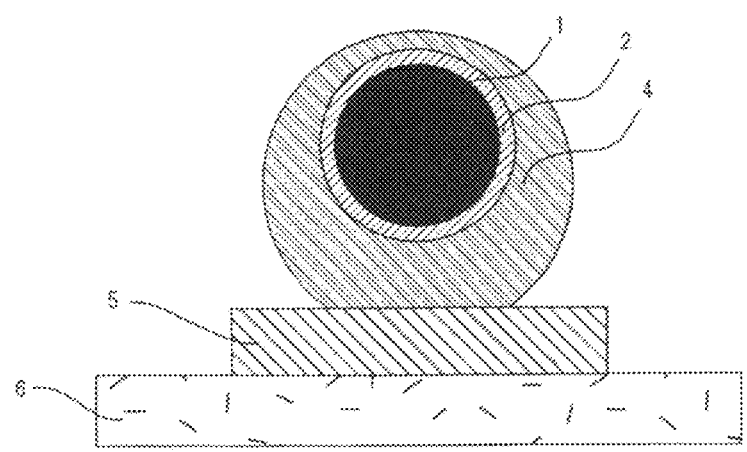
FIG. 2 is an example of a cross sectional view schematically showing a conductive fine particle after being mounted.
Figure 3:
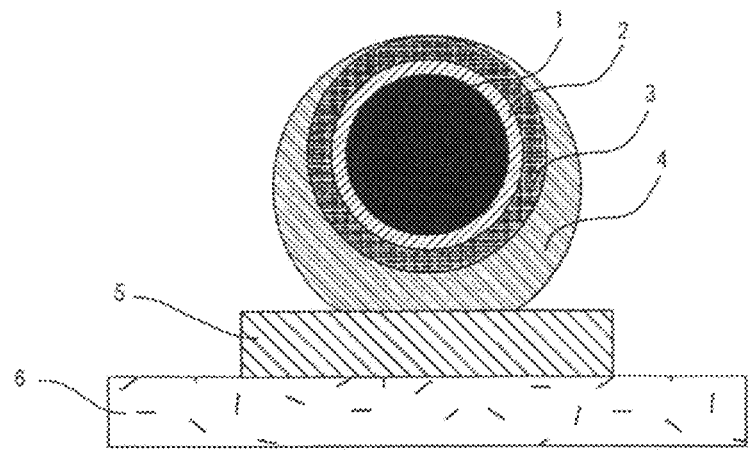
FIG. 3 is an example of a cross sectional view schematically showing a conductive fine particle after being mounted.
Figure 4:
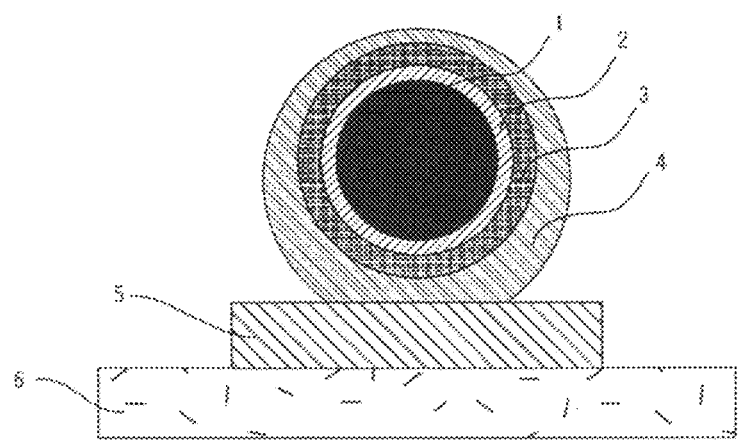
FIG. 4 is an example of a cross sectional view schematically showing a conductive fine particle after being mounted.
Figure 5:
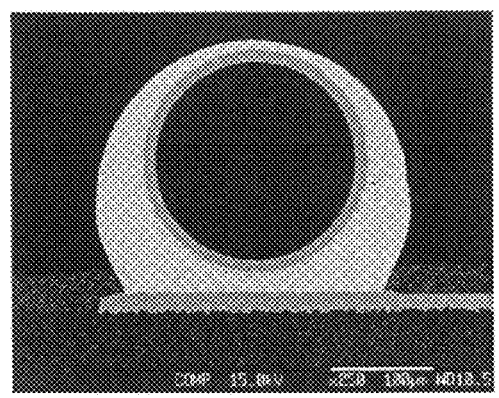
FIG. 5 is a cross-sectional image of a conductive fine particle after being mounted in Example 3.
Figure 6:
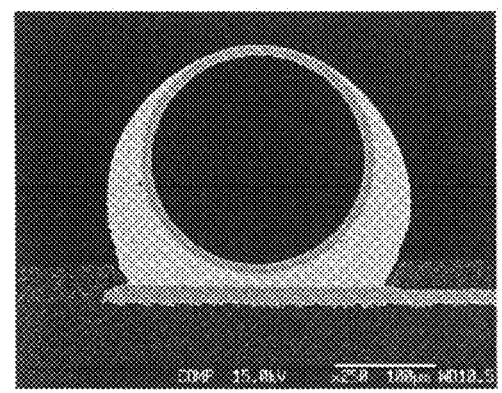
FIG. 6 is a cross-sectional image of a conductive fine particle after being mounted in Comparative Example 1.

| EXPLANATION OF REFERENCE | |
|---|---|
| 1 | Resin fine particle |
| 2 | Metal layer |
| 3 | Barrier layer |
| 4 | Solder layer |
| 5 | Electrode |
| 6 | Substrate |

The invention claimed is:

1. A conductive fine particle,
which comprises:
a resin fine particle,
a solder layer containing tin formed on a surface of the resin fine particle, and
nickel partially covering and being adhered to an outer surface of said solder layer,
wherein said conductive fine particle contains 0.0001 to 5.0% by weight of the nickel with respect to a total weight of metal contained in said solder layer and in the nickel adhered to the surface of said solder layer.

2. The conductive fine particle according to claim 1,
wherein a metal layer is further formed between the surface of the resin fine particle and the solder layer containing tin.

3. The conductive fine particle according to claim 2,
wherein the metal layer contains copper.

4. The conductive fine particle according to claim 2,
wherein a barrier layer is further formed between the metal layer and the solder layer containing tin.

5. The conductive fine particle according to claim 4,
wherein the barrier layer contains nickel.

6. An anisotropic conductive material,
which is obtained by dispersing the conductive fine particle according to claim 1 in a binder resin.

7. A conductive connection structure,
comprising the conductive fine particle according to claim 1.

* * * * *